(12) United States Patent
Chou et al.

(10) Patent No.: US 7,545,221 B1
(45) Date of Patent: Jun. 9, 2009

(54) SIGNAL AMPLIFYING APPARATUS INCLUDING I/O DEVICES AND CORE DEVICES

(75) Inventors: Chia-Hua Chou, Taipei County (TW); Kang-Wei Hsueh, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 25 days.

(21) Appl. No.: 11/970,525

(22) Filed: Jan. 8, 2008

(51) Int. Cl.
*H03F 3/68* (2006.01)

(52) U.S. Cl. ...................................... 330/311

(58) Field of Classification Search ................. 330/311, 330/277, 295
See application file for complete search history.

(56) References Cited

U.S. PATENT DOCUMENTS

| | | | |
|---|---|---|---|
| 7,330,074 B2* | 2/2008 | Kang et al. | 330/255 |
| 2007/0296456 A1* | 12/2007 | van der Goes et al. | 326/30 |

OTHER PUBLICATIONS

David B. Ribner and Miles A. Copeland, Design Techniques for Cascoded CMOS Op Amps with Improved PSRR and Common-Mode Input Range, IEEE Journal of Solid-State Circuits, Dec. 1984, p. 919~925, vol. SC-19, No. 6.
Ron Hogervorst, John P. Tero, Ruud G. H. Eschauzier, and Johan H. Huijsing, A Compact Power-Efficient 3 V CMOS Rail-to-Rail Input/Output Operational Amplifier for VLSI Cell Libraries, IEEE Journal of Solid-State Circuits, Dec. 1994, p. 1505~1513, vol. 29, No. 12.
Bhupendra K. Ahuja, An Improved Frequency Compensation Technique for CMOS Operational Amplifiers, IEEE Journal of Solid-State Circuits, Dec. 1983, p. 629~633, vol. SC-18, No. 6.
B. Yeshwant Kamath, Robert G. Meyer, and Paul R. Gray, Relationship Between Frequency Response and Settling Time of Operational Amplifiers, IEEE Journal of Solid-State Circuits, Dec. 1974, p. 347~352, vol. SC-9, No. 6.
Mohammad Yavari, Omid Shoaei, and Francesco Svelto, Hybrid Cascode Compensation for Two-Stage CMOS Operational Amplifiers, IEEE, 2005, p. 1565~1568.
Gray/Hurst/Lewis/Meyer, Frequency Response and Stability of Feedback Amplifiers, Analysis and Design of Analog Integrated Circuits, 2001, p. 644~653, Fourth Edition, John Wiley & Sons.

* cited by examiner

*Primary Examiner*—Robert Pascal
*Assistant Examiner*—Khiem D Nguyen
(74) *Attorney, Agent, or Firm*—Winston Hsu (57) ABSTRACT

The present invention provides a signal amplifying apparatus, for converting a first input signal into a first output signal. The signal amplifying apparatus includes an input stage circuit for receiving the first input signal; a cascoded circuit coupled to the input stage circuit, including a plurality of first cascoded transistors, wherein equivalent oxide thicknesses of the first cascoded transistors are not the same; an output stage circuit has a first input port coupled to the cascoded circuit, and a first output port for outputting the first output signal; and a first capacitor has a first terminal connected to the first output port of the output stage circuit and a second terminal coupled to the cascoded circuit, wherein the second terminal is not connected to the first input port of the output stage circuit.

12 Claims, 7 Drawing Sheets

SIGNAL AMPLIFYING APPARATUS INCLUDING I/O DEVICES AND CORE DEVICES

BACKGROUND

The present invention relates to an electronic device, and more particularly, to a signal amplifying apparatus.

Figure 1:
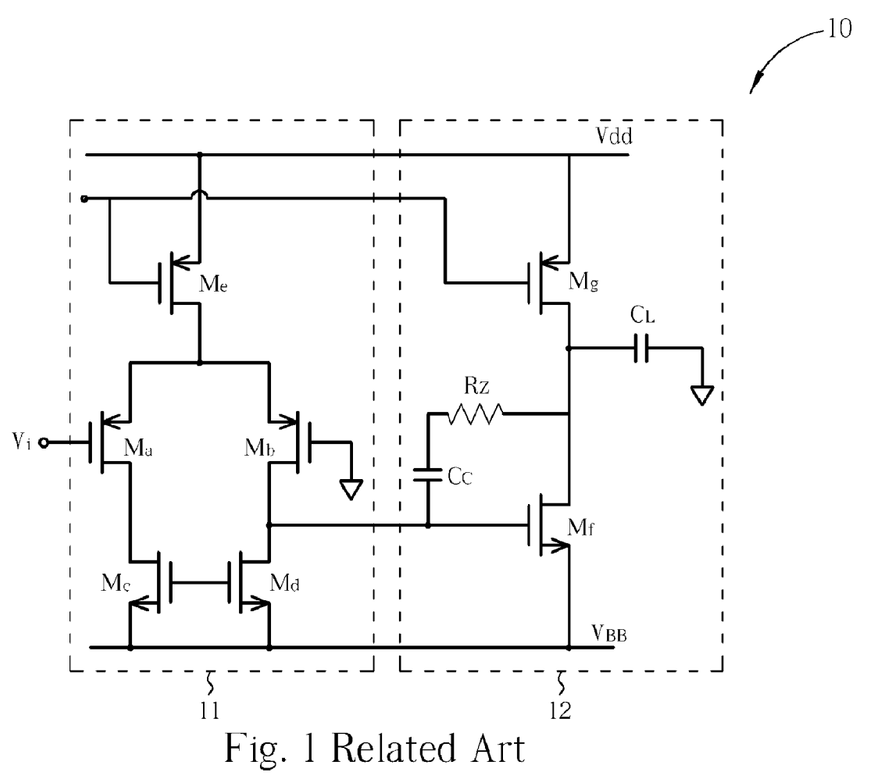
FIG. 1 is a diagram illustrating a conventional operating amplifier.

Please refer to FIG. 1. FIG. 1 is a diagram illustrating a conventional operating amplifier 10. The prior art operating amplifier 10 comprises an input differential stage 11 and an output stage 12. In brief, transistors $M_a$-$M_e$ form the input differential stage 11, and transistors $M_f$-$M_g$ form the output stage 12. According to the related art, the operating amplifier 10 has a dominant pole, two complex high frequency poles, and a zero. Due to the feed-forward path, which is formed by compensation resistor $R_z$ and compensation capacitor $C_c$, with no inversion from the input differential stage 11 to the output stage 12 at high frequency, the performance of the operating amplifier displays two degradations. The first is severe degradation of the operating amplifier 10 for capacitive loads $C_L$ of the same order as compensation capacitor $C_c$. The second is the negative power supply $V_{BB}$ displaying a zero at the dominant pole frequency of the operating amplifier 10 in unity gain configuration due to the PMOS transistors in the input differential stage 11. This results in serious performance degradation for sampled data systems that use high-frequency switching regulators to generate their power supplies.

Figure 2:
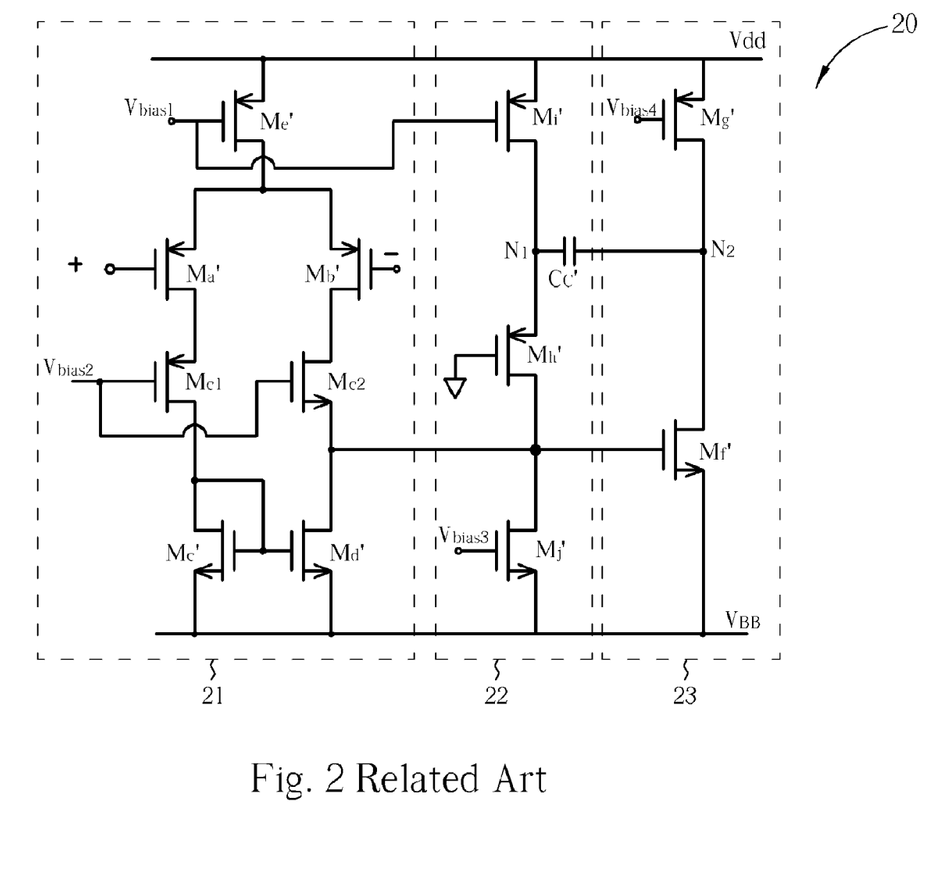
FIG. 2 is a diagram illustrating another conventional operating amplifier.

Please refer to FIG. 2. FIG. 2 is a diagram illustrating another conventional operating amplifier 20. The operating amplifier 20 comprises an input differential stage 21, a current transformer 22, and an output stage 23. The input differential stage 21 formed by transistors $M_a'$-$M_e'$ uses cascade devices $M_{c1}$-$M_{c2}$ to reduce supply capacitance from the negative power supply $V_{BB}$ for switched-capacitor applications. The current transformer 22 is formed by $M_h'$-$M_j'$, in which the technique has been referred to as the "grounded gate cascade compensation". The output stage 23 is formed by $M_f'$-$M_g'$. Compared with the operating amplifier 10 shown in FIG. 1, the operating amplifier 20 provides a virtual ground at node $N_1$ to eliminate the feed-forward path but still produces a dominant pole due to the Miller effect. Therefore, the compensation capacitor $C_c'$ is connected between the output node $N_2$ and a virtual ground at $N_1$. When designing a high-bandwidth operating amplifier, however, the operating amplifier 20 usually suffers from pole-zero doublet near unity-gain frequency. This is because the pole-zero doublet in the amplifier's unity-gain bandwidth elongates the amplifier's settling time, and consequently limits the amplifier's high-speed performance.

SUMMARY

Therefore, the present invention discloses a signal amplifying apparatus having higher settling time by using I/O devices in conjunction with core devices.

According to an embodiment of the present invention, a signal amplifying apparatus is disclosed for converting a first input signal into a first output signal. The signal amplifying apparatus includes an input stage circuit, a cascoded circuit, an output stage circuit, and a first capacitor. The input stage circuit is utilized for receiving the first input signal; the cascoded circuit, coupled to the input stage circuit, comprises a plurality of first cascoded transistors, wherein equivalent oxide thicknesses of the first cascoded transistors are not the same; the output stage circuit has a first input port coupled to the cascoded circuit, and a first output port for outputting the first output signal; and the first capacitor has a first terminal connected to the first output port of the output stage circuit and a second terminal coupled to the cascaded circuit, wherein the second terminal is not connected to the first input port of the output stage circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
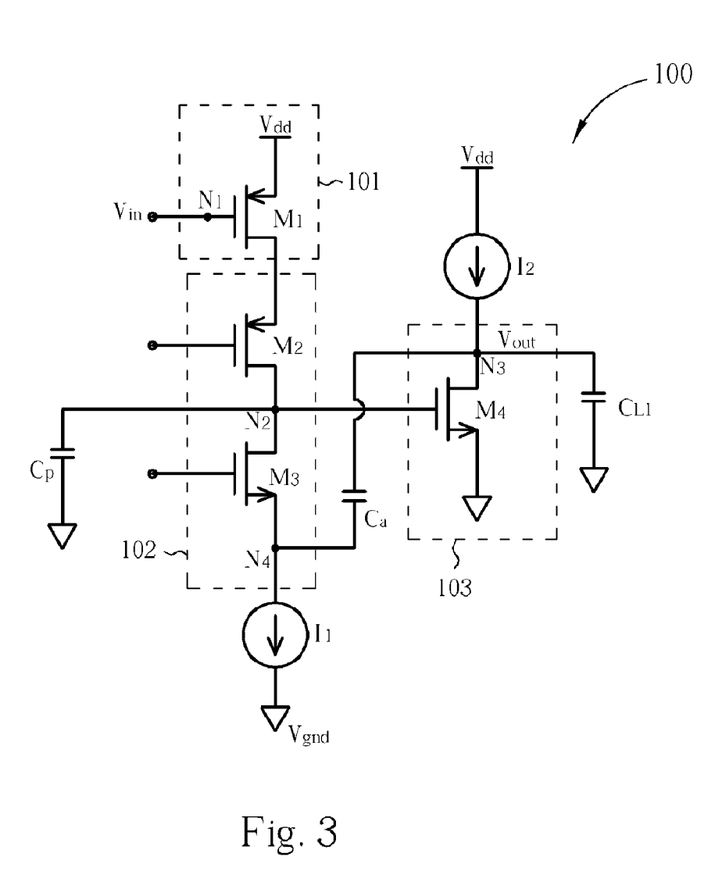
FIG. 3 is a diagram illustrating a signal amplifying apparatus according to a first embodiment of the present invention.

Please refer to FIG. 3. FIG. 3 is a diagram illustrating a signal amplifying apparatus 100 according to a first embodiment of the present invention. The signal amplifying apparatus 100 is utilized for converting a first input signal $V_{in}$ into a first output signal $V_{out}$, and comprises an input stage circuit 101, a cascoded circuit 102, an output stage circuit 103 and a first capacitor $C_a$. The input stage circuit 101 comprises a P-type transistor $M_1$ having a gate terminal (node $N_1$) for receiving the first input signal $V_{in}$; the cascoded circuit 102 comprises a P-type transistor $M_2$ and an N-type transistor $M_3$, in which a source terminal of the P-type transistor $M_2$ is coupled to a drain terminal of the P-type transistor $M_1$; and the N-type transistor $M_3$ has a drain terminal $N_2$ coupled to a drain terminal of the P-type transistor $M_2$. The output stage circuit 103 comprises an N-type transistor $M_4$ having a gate terminal coupled to the drain terminal (node $N_2$) of the N-type transistor $M_3$, and the first output signal $V_{out}$ is outputted at a drain terminal (node $N_3$) of the N-type transistor $M_4$. As shown in FIG. 3, the capacitor $C_a$ has a first terminal connected to the drain terminal (node $N_3$) of the N-type transistor $M_4$ and a second terminal coupled to a source terminal (node $N_4$) of the N-type transistor $M_3$. An equivalent oxide thickness of the N-type transistor $M_3$ is smaller than an equivalent oxide thickness of the P-type transistor $M_1$, the P-type transistor $M_2$, and the N-type transistor $M_4$. Please note that, in the embodiment, transistors having different equivalent oxide thicknesses correspond to different transistor types in a semiconductor process; for example, an I/O device in the semiconductor process has an equivalent oxide thickness that is thicker than an equivalent oxide thickness of a core device. Furthermore, the source terminal of the P-type transistor $M_1$ is connected to a supply source $V_{dd}$; a current source $I_1$ is coupled between the node $N_4$ and ground $V_{gnd}$; a current source $I_2$ is coupled between the node $N_3$ and the supply source $V_{dd}$; a capacitor $C_P$ is coupled to node $N_2$; and a loading capacitor $C_{L1}$ exists at node $N_3$ as shown in FIG. 3.

Figure 4:
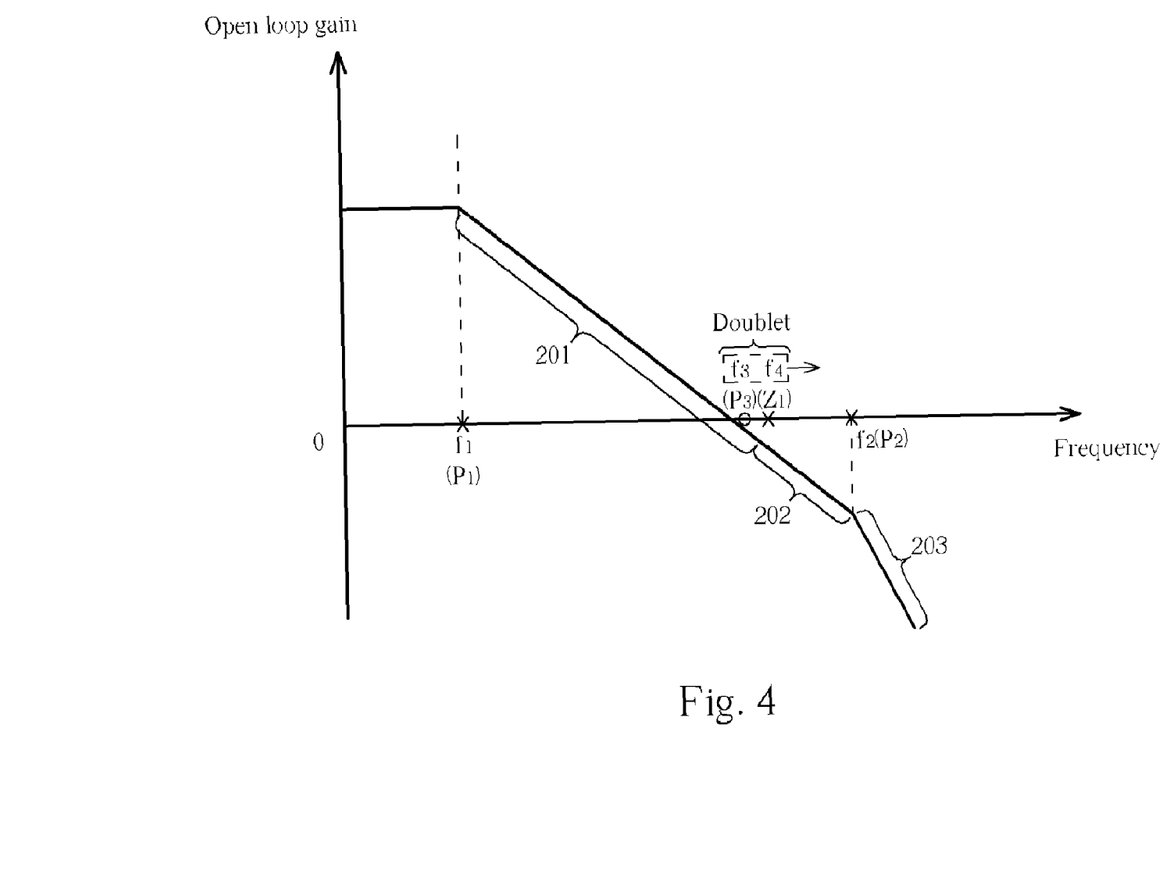
FIG. 4 is a Bode plot diagram illustrating the frequency response of the transfer function between the first input signal and the first output signal.

Please refer to FIG. 4. FIG. 4 is a Bode plot diagram illustrating the frequency response of the transfer function between the first input signal $V_{in}$ and the first output signal $V_{out}$. In FIG. 4, the x-axis represents frequency positions of poles and a zero of the signal amplifying apparatus 100; and the y-axis represents open loop gain between node $N_3$ and node $N_1$ of the signal amplifying apparatus 100. Accordingly, there are three main poles and one main zero existing in the signal amplifying apparatus 100. The first pole $P_1$ therein exists at frequency $f_1$, the second pole $P_2$ exists at frequency $f_2$, the third pole $P_3$ exists at frequency $f_3$, and the main zero $Z_1$ exists at frequency $f_4$ as shown in FIG. 4. Accordingly, at frequency $f_1$, a −20 dB/decade slope (line 201) will appear, and line 201 will then pass through the unity-gain frequency. Then, as the frequency $f_3$ of the third pole $P_3$ is close to the frequency $f_4$ of the main zero $Z_1$, which is a pole-zero doublet frequency, the −20 dB/decade slope (line 202) will continue until it reaches the frequency $f_2$. Then, a −40 dB/decade slope (line 203) will continue to the higher frequency. Please note that the detailed calculation of the frequencies $f_1$, $f_2$, $f_3$, and $f_4$ can be easily performed by one skilled in this art, and so further description is omitted here. Furthermore, because the pole-zero doublet frequency will dictate the operating speed of the signal amplifying apparatus 100, the higher the frequency $f_3$ of the third pole $P_3$ and the frequency $f_4$ of the main zero $Z_1$, the lower the settling time of the signal amplifying apparatus 100 that will be obtained. According to the present invention, the frequency $f_3$ of the third pole $P_3$ and the frequency $f_4$ of the main zero $Z_1$ are mainly decided by the transconductance of the N-type transistor $M_3$, therefore if the transconductance of the N-type transistor $M_3$ is increased, the pole-zero doublet frequency of the signal amplifying apparatus 100 also increases. In other words, the settling time of the N-type transistor $M_4$ gets smaller. Therefore, in this embodiment, the N-type transistor $M_3$ is implemented using a core device, in which the core device has a higher transconductance than the I/O device. Furthermore, because the core device can bear a lower cross voltage than the I/O device, the N-type transistor $M_3$ should be carefully designed. Accordingly, the newly pole-zero doublet frequency is moved right while the original bode plot of the signal amplifying apparatus 100, as shown in of FIG. 4, is unchanged.

Figure 5:
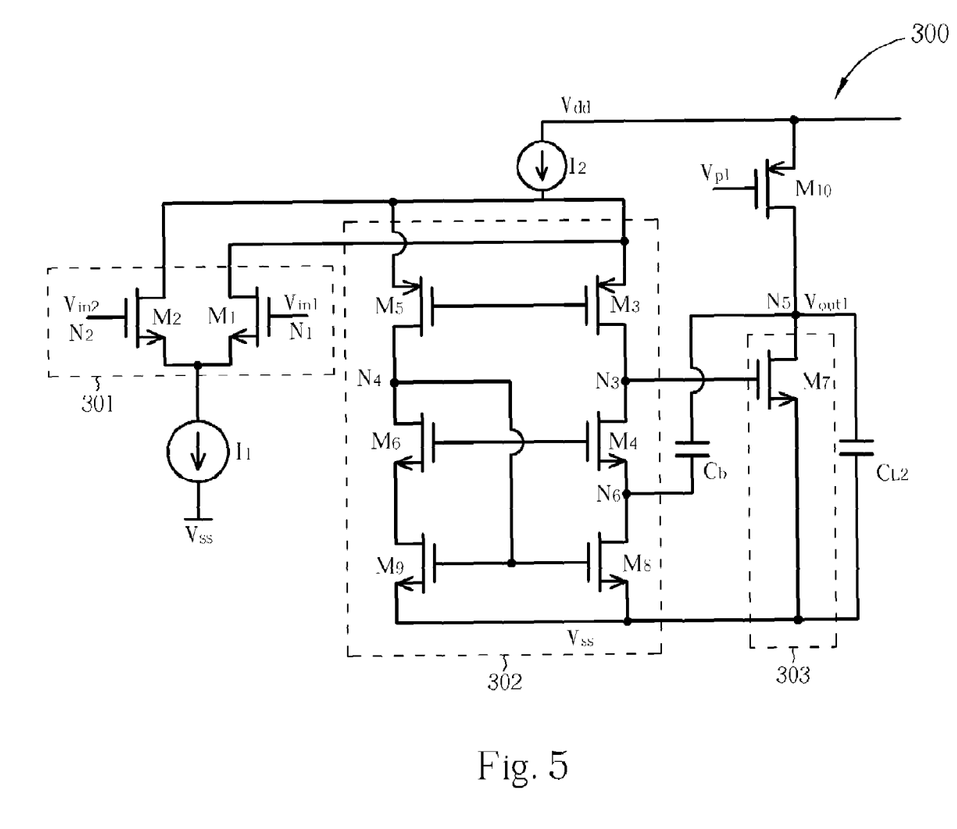
FIG. 5 is a diagram illustrating a signal amplifying apparatus according to a second embodiment of the present invention.

Please refer to FIG. 5. FIG. 5 is a diagram illustrating a signal amplifying apparatus 300 according to a second embodiment of the present invention. The signal amplifying apparatus 300 is a differential input single output amplifier for converting a differential input signal $V_{in1}$ and $V_{in2}$ into an output signal $V_{out1}$. The signal amplifying apparatus 300 comprises a differential input stage circuit 301, a differential cascoded circuit 302, an output stage circuit 303 and a capacitor $C_b$. The differential input stage circuit 301 comprises an N-type transistor $M_1$ having a gate terminal (node $N_1$) to receive the first input signal $V_{in1}$ and an N-type transistor $M_2$ having a gate terminal (node $N_2$) to receive the second input signal $V_{in2}$. The differential cascoded circuit 302 comprises a P-type transistor $M_3$, an N-type transistor $M_4$, a P-type transistor $M_5$, and an N-type transistor $M_6$, in which a source terminal of the P-type transistor $M_3$ is coupled to a drain terminal of the N-type transistor $M_1$, the N-type transistor $M_4$ has a drain terminal $N_3$ coupled to a drain terminal of the P-type transistor $M_3$, a source terminal of the P-type transistor $M_5$ is coupled to a drain terminal of the N-type transistor $M_2$, and the N-type transistor $M_6$ has a drain terminal $N_4$ coupled to a drain terminal of the P-type transistor $M_5$. The output stage circuit 303 comprises an N-type transistor $M_7$ having a gate terminal coupled to the drain terminal (node $N_3$) of the N-type transistor $M_4$, and the output signal $V_{out1}$ is outputted at a drain terminal (node $N_5$) of the N-type transistor $M_7$. As shown in FIG. 5, the capacitor $C_b$ has a first terminal connected to the drain terminal (node $N_5$) of the N-type transistor $M_7$ and the second terminal of the capacitor $C_b$ is coupled to a source terminal (node $N_6$) of the N-type transistor $M_4$.

Furthermore, an N-type transistor $M_8$ and an N-type transistor $M_9$ are connected as a current mirror configuration coupled to the N-type transistors $M_4$ and $M_6$ as shown in FIG. 5. The equivalent oxide thicknesses of each of the N-type transistors $M_4$ and $M_6$ is smaller than an equivalent oxide thickness of each of the N-type transistors $M_1$ and $M_2$, the P-type transistors $M_3$ and $M_5$, and the N-type transistor $M_7$. Please note that, as in the above first embodiment, the transistors having different equivalent oxide thicknesses correspond to different transistor types in a semiconductor process. In this embodiment, the N-type transistor $M_4$ and $M_6$ are core devices, and the others are I/O devices. Furthermore, a current source $I_1$ is coupled between the source terminal of the N-type transistor $M_1$ and $M_2$ and a ground $V_{ss}$; a current source $I_2$ is coupled between the differential cascoded circuit 302 and a supply source $V_{dd}$; a P-type transistor $M_{10}$ is coupled between the output stage circuit 303 and the supply source $V_{dd}$, in which the P-type transistor $M_{10}$ is controlled by a control voltage $V_{p1}$, and a loading capacitor $C_{L2}$ exists at node $N_5$ as shown in FIG. 5. Please note that the operation of increasing the operating speed of the signal amplifying apparatus 300 is mostly the same as the signal amplifying apparatus 100 and can be readily understood by a person skilled in this art after reading the above disclosure, thus the detailed description is omitted here for brevity.

Figure 6:
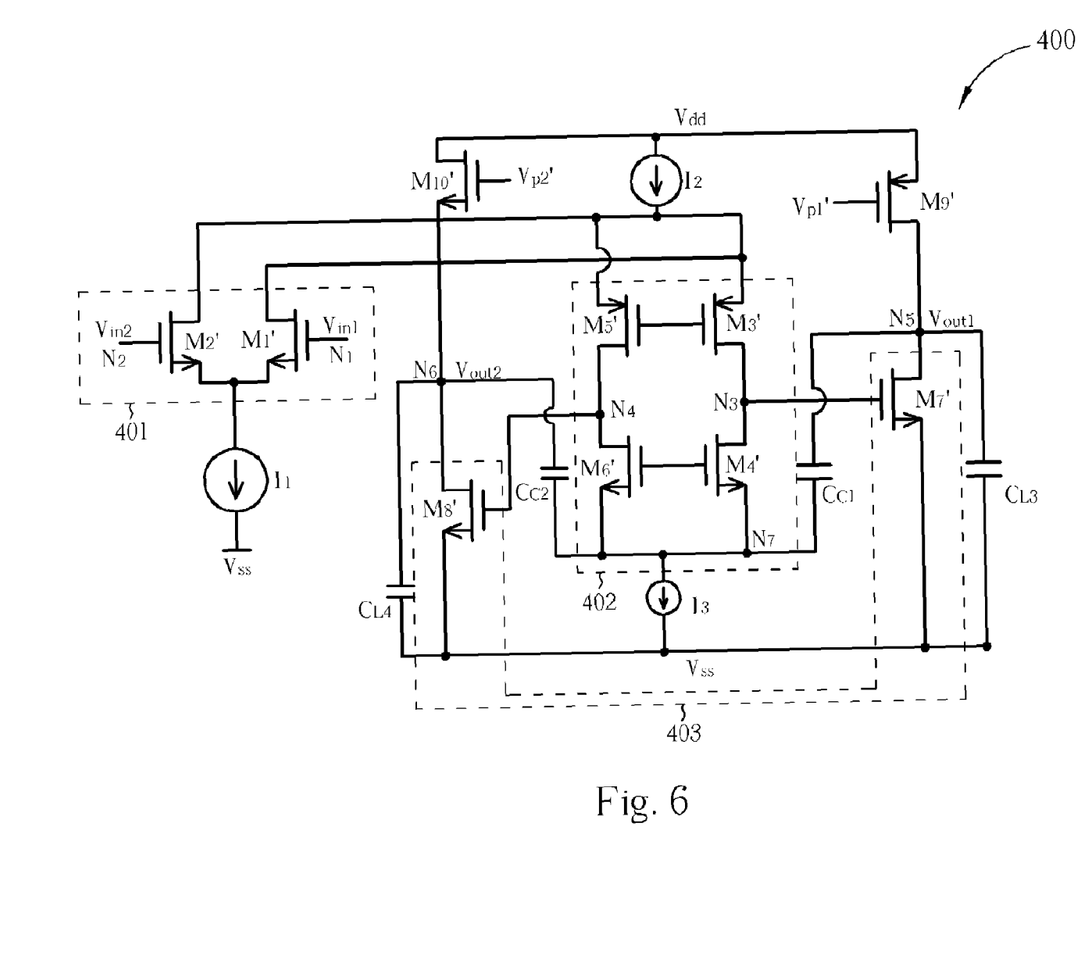
FIG. 6 is a diagram illustrating a signal amplifying apparatus according to a third embodiment of the present invention.

Please refer to FIG. 6. FIG. 6 is a diagram illustrating a signal amplifying apparatus 400 according to a third embodiment of the present invention. The signal amplifying apparatus 400 is a differential input differential output amplifier for converting a differential input signal $V_{in1}$ and $V_{in2}$ into a differential output signal $V_{out1}$ and $V_{out2}$. The signal amplifying apparatus 400 comprises a differential input stage circuit 401, a differential cascoded circuit 402, a differential output stage circuit 403 and capacitors $C_{c1}$ and $C_{c2}$. The differential input stage circuit 401 comprises an N-type transistor $M_1''$ having a gate terminal (node $N_1$) to receive the first input signal $V_{in1}$ and an N-type transistor $M_2$ having a gate terminal (node $N_2$) to receive the second input signal $V_{in2}$. The differential cascoded circuit 402 comprises a P-type transistor $M_3'$, an N-type transistor $M_4'$, a P-type transistor $M_5'$, and an N-type transistor $M_6'$, in which a source terminal of the P-type transistor $M_3'$ is coupled to a drain terminal of the N-type transistor $M_1''$, the N-type transistor $M_4'$ has a drain terminal $N_3$ coupled to a drain terminal of the P-type transistor $M_3$, a source terminal of the P-type transistor $M_5'$ is coupled to a drain terminal of the N-type transistor $M_2'$, and the N-type transistor $M_6'$ has a drain terminal $N_4$ coupled to a drain terminal of the P-type transistor $M_5'$. The differential output stage circuit 403 comprises an N-type transistor $M_7'$ having a gate terminal coupled to the drain terminal (node $N_3$) of the N-type transistor $M_4'$, an N-type transistor $M_8'$ having a gate terminal coupled to the drain terminal (node $N_4$) of the N-type transistor $M_6'$, where the first output signal $V_{out1}$ is outputted at a drain terminal (node $N_5$) of the N-type transistor $M_7'$, the second output signal $V_{out2}$ is outputted at a drain terminal (node $N_6$) of the N-type transistor $M_8'$. As shown in FIG. 6, the capacitor $C_{c1}$ has a first terminal connected to the drain terminal (node $N_5$) of the N-type transistor $M_7$ and a second terminal coupled to a source terminal (node $N_7$) of the N-type transistor $M_4'$. The capacitor $C_{c2}$ has a first terminal connected to the drain terminal (node $N_6$) of the N-type transistor $M_8'$ and a second terminal coupled to a source terminal (node $N_8$) of the N-type transistor $M_8'$.

Furthermore, a current source $I_1$ is coupled between the source terminal of the N-type transistor $M_1''$ and $M_2'$ and a ground $V_{ss}$; a current source $I_2$ is coupled between the differential cascoded circuit 402 and a supply source $V_{dd}$; a current source $I_3$ is coupled between the differential cascoded circuit 402 and a ground $V_{ss}$; a P-type transistor $M_9'$ is coupled between the N-type transistor $M_7'$ and the supply source $V_{dd}$, in which the P-type transistor $M_9'$ is controlled by a control voltage $V_{p1}$; a P-type transistor $M_{10}'$ is coupled between the N-type transistor $M_8'$ and the supply source $V_{dd}$, in which the P-type transistor $M_{10}'$ is controlled by a control voltage $V_{p2}$; a loading capacitor $C_{L3}$ exists at node $N_5$ and a loading capacitor $C_{L4}$ exists at node $N_6$ as shown in FIG. 6. In this embodiment, the equivalent oxide thicknesses of the N-type transistors $M_4'$ and $M_6'$ are smaller than an equivalent oxide thickness of each of the N-type transistors $M_1''$ and $M_2'$, the P-type transistors $M_3'$ and $M_5'$, the N-type transistors $M_7'$ and $M_8'$, and the P-type transistors $M_9'$ and $M_{10}'$. Please note that, as in the first and second embodiments, the transistors having different equivalent oxide thicknesses correspond to different transistor types in a semiconductor process. In this embodiment, the N-type transistors $M_4'$ and $M_6'$ are core devices, and the others are I/O devices. Please note that the operation of increasing the operating speed of signal amplifying apparatus 400 is mostly the same as signal amplifying apparatuses 100, 300 and can be readily realized by a person skilled in this art after reading the above disclosure, thus the detailed description is omitted here for brevity.

Figure 7:
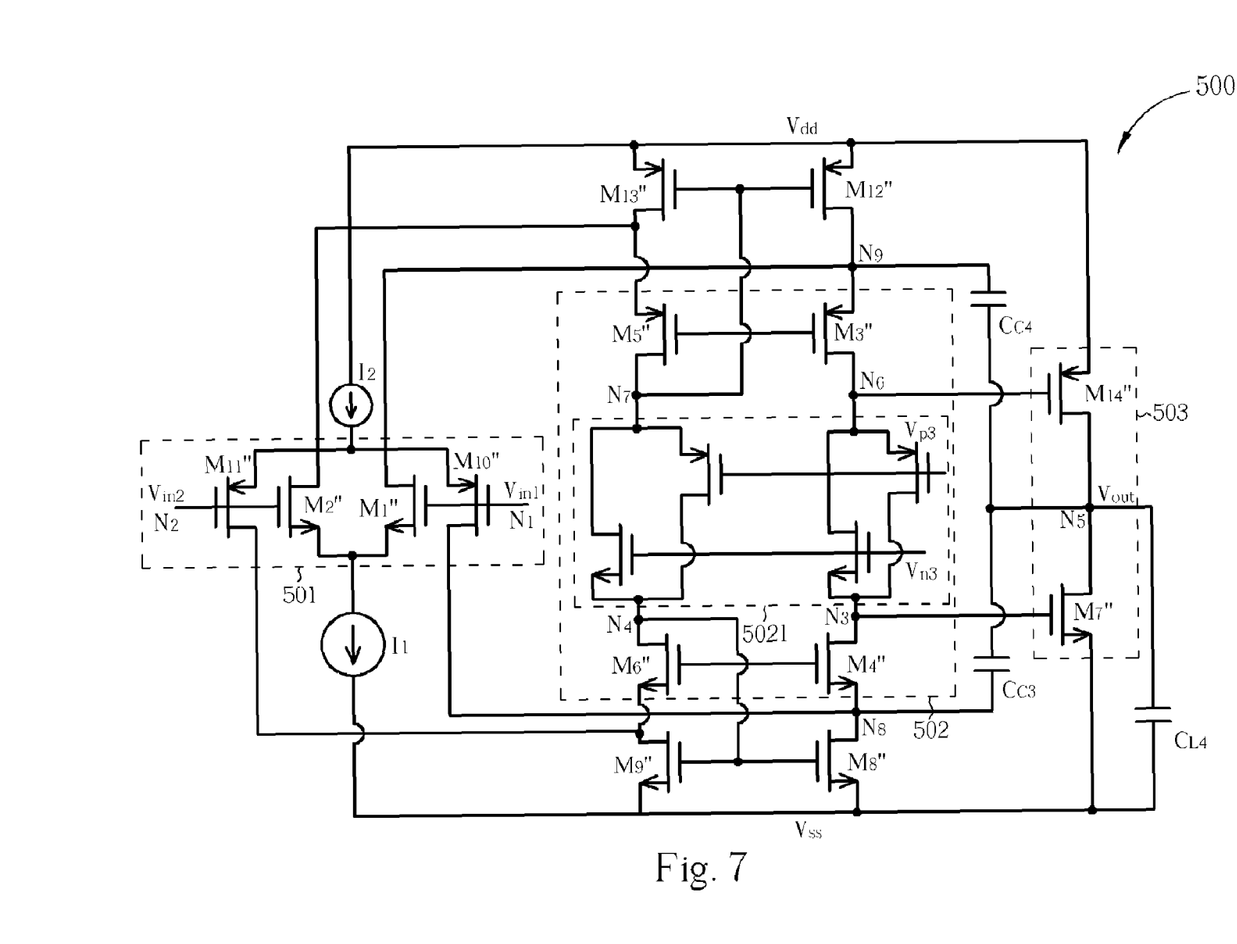
FIG. 7 is a diagram illustrating a signal amplifying apparatus according to a fourth embodiment of the present invention.

Please refer to FIG. 7. FIG. 7 is a diagram illustrating a signal amplifying apparatus 500 according to a fourth embodiment of the present invention. The signal amplifying apparatus 500 is a differential input single output amplifier for converting a differential input signal $V_{in1}$ and $V_{in2}$ into an output signal $V_{out}$. The signal amplifying apparatus 500 comprises a differential input stage circuit 501, a differential cascoded circuit 502, an output stage circuit 503, and capacitors $C_{c3}$ and $C_{c4}$. The differential input stage circuit 501 comprises an N-type transistor $M_1''$ and a P-type transistor $M_{10}''$ having gate terminals (node $N_1$) to receive the first input signal $V_{in1}$; and an N-type transistor $M_2'$ and a P-type transistor $M_{11}''$ having gate terminals (node $N_2$) to receive the second input signal $V_{in2}$. The differential cascoded circuit 502 comprises a P-type transistor $M_3''$, an N-type transistor $M_4''$, a P-type transistor $M_5'$, and an N-type transistor $M_6''$, in which a source terminal of the P-type transistor $M_3'$ is coupled to a drain terminal of the N-type transistor $M_1''$, the N-type transistor $M_4'$ has a drain terminal $N_3$ coupled to a drain terminal of the P-type transistor $M_3''$, a source terminal of the P-type transistor $M_5''$ is coupled to a drain terminal of the N-type transistor $M_2''$, and the N-type transistor $M_6''$ has a drain terminal $N_4$ coupled to a drain terminal of the P-type transistor $M_5''$. Furthermore, a DC level shifter 5021 is coupled between the P-type transistor $M_3''$ and N-type transistor $M_4''$ and between the P-type transistor $M_5''$ and N-type transistor $M_6''$. In this embodiment, the DC level shifter 5021 comprises two P-type transistors and two N-type transistors and is controlled by voltage $V_{p3}$ and $V_{n3}$, respectively as shown in FIG. 7. Please note that the DC level shifter 5021 is a well-known component, thus the detailed description is omitted here for brevity. The output stage circuit 503 comprises an N-type transistor $M_7''$ having a gate terminal coupled to the drain terminal (node $N_3$) of the N-type transistor $M_4''$, and the output signal $V_{out}$ is outputted at a drain terminal (node $N_5$) of the N-type transistor $M_7''$; similarly, a P-type transistor $M_{14}''$ has a gate terminal coupled to the drain terminal (node $N_6$) of the P-type transistor $M_3''$, and the output signal $V_{out}$ is outputted at a drain terminal (node $N_5$) of the P-type transistor $M_{14}''$. As shown in FIG. 7, the capacitor $C_{c3}$ has a first terminal connected to the drain terminal (node $N_5$) of the N-type transistor $M_7''$ and a second terminal coupled to a source terminal (node $N_8$) of the N-type transistor $M_4''$. Additionally, the capacitor $C_{c4}$ has a first terminal connected to the drain terminal (node $N_5$) of the N-type transistor $M_7''$ and a second terminal coupled to a source terminal (node Ng) of the P-type transistor $M_3''$.

Furthermore, an N-type transistor $M_8''$ and an N-type transistor $M_9''$ are connected as a current mirror configuration coupled to the N-type transistors $M_4''$ and $M_6''$; similarly, a P-type transistor $M_{12}''$ and a P-type transistor $M_{13}''$ are connected as another current mirror configuration coupled to the P-type transistors $M_3''$ and $M_5''$. The equivalent oxide thicknesses of the N-type transistors $M_4''$ and $M_6''$, and the P-type transistors $M_3''$ and $M_5''$ are smaller than an equivalent oxide thickness of each of the N-type transistors $M_1''$, $M_2''$, $M_7''$, $M_8''$, $M_9''$, the P-type transistors $M_{10}''$, $M_{11}''$, $M_{12}''$, $M_{13}''$, $M_{14}''$ and transistors within the DC level shifter 5021. Please note that, as mentioned above, the transistors having different equivalent oxide thicknesses correspond to different transistor types in a semiconductor process. In this embodiment, the N-type transistors $M_4''$, $M_6''$ and the P-type transistors $M_3''$, $M_5''$ are core devices, and the others are I/O devices. Furthermore, a current source $I_1$ is coupled between the source terminal of the N-type transistor $M_1''$ and $M_2''$ and a ground $V_{ss}$; a current source $I_2$ is coupled between the source terminal of the P-type transistor $M_{10}''$ and $M_{11}''$ and a supply voltage $V_{dd}$; and a loading capacitor $C_{L4}$ exists at node $N_5$ as shown in FIG. 7. Please note that the operation of increasing the operating speed of the signal amplifying apparatus 500 is mostly the same as the signal amplifying apparatus 100 and can be readily understood by a person skilled in this art after reading the above-mentioned disclosure, thus the detailed description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal amplifying apparatus, for converting a first input signal into a first output signal, comprising:
    an input stage circuit, for receiving the first input signal;
    a cascoded circuit, coupled to the input stage circuit, the cascoded circuit comprising a plurality of first cascoded transistors, wherein equivalent oxide thicknesses of the first cascoded transistors are not the same;
    an output stage circuit, having a first input port coupled to the cascoded circuit, and a first output port for outputting the first output signal; and
    a first capacitor, having a first terminal connected to the first output port of the output stage circuit and a second terminal coupled to the cascoded circuit, wherein the second terminal is not connected to the first input port of the output stage circuit.

2. The signal amplifying apparatus of claim 1, wherein the input stage comprises:
    a first transistor having a control terminal for receiving the first input signal;
    the cascoded circuit is coupled to a first terminal of the first transistor, and comprises:

a second transistor, having a first terminal coupled to the first terminal of the first transistor;

a third transistor, having a first terminal coupled to a second terminal of the second transistor;

the output stage circuit comprises:

a fourth transistor, having a control terminal coupled to the first terminal of the third transistor, for outputting the first output signal at a first terminal of the fourth transistor;

the first terminal of the first capacitor is coupled to the first terminal of the fourth transistor and the second terminal of the first capacitor is coupled to a second terminal of the third transistor; and an equivalent oxide thickness of the third transistor is smaller than an equivalent oxide thickness of at least one of the first, second, and fourth transistors.

3. The signal amplifying apparatus of claim 2, wherein the equivalent oxide thickness of the third transistor is smaller than an equivalent oxide thickness of each of the first, second, and fourth transistors.

4. The signal amplifying apparatus of claim 2, wherein the input stage circuit further receives a second input signal, where the first input signal and the second input signal form a differential signal; the cascoded circuit further comprises a plurality of second cascoded transistors, where equivalent oxide thicknesses of the second cascoded transistors are not the same.

5. The signal amplifying apparatus of claim 4, wherein the input stage comprises:

a first transistor having a control terminal for receiving the first input signal;

a second transistor having a control terminal for receiving the second input signal;

the cascoded circuit is coupled to a first terminal of the first transistor and a first terminal of the second transistor, and comprises:

a third transistor, having a first terminal coupled to the first terminal of the first transistor;

a fourth transistor, having a first terminal coupled to a second terminal of the third transistor;

a fifth transistor, having a first terminal coupled to the first terminal of the second transistor;

a sixth transistor, having a first terminal coupled to a second terminal of the fifth transistor;

the output stage circuit comprises:

a seventh transistor, having a control terminal coupled to the first terminal of the third transistor, for outputting the first output signal at a first terminal of the seventh transistor;

the first terminal of the first capacitor is coupled to the first terminal of the seventh transistor and the second terminal of the first capacitor is coupled to a second terminal of the fourth transistor; and an equivalent oxide thickness of the fourth transistor is smaller than an equivalent oxide thickness of at least one of the first, third, and seventh transistors.

6. The signal amplifying apparatus of claim 5, wherein the cascoded circuit further comprises:

an eighth transistor, having a first terminal coupled to the second terminal of the fourth transistor; and a ninth transistor, having a control terminal coupled to a control terminal of the eighth transistor and the first terminal of the sixth transistor, and a first terminal coupled to a second terminal of the sixth transistor;

wherein an equivalent oxide thickness of each of the fourth and sixth transistors is smaller than an equivalent oxide thickness of at least one of the first, second, third, fifth, seventh, eight, and ninth transistors.

7. The signal amplifying apparatus of claim 6, wherein the equivalent oxide thickness of each of the fourth and sixth transistors is smaller than an equivalent oxide thickness of each of the first, second, third, fifth, seventh, eight, and ninth transistors.

8. The signal amplifying apparatus of claim 7, wherein the input stage circuit further comprises:

a tenth transistor, having a control terminal coupled to the control terminal of the first transistor, and a first terminal coupled to the second terminal of the first capacitor;

an eleventh transistor, having a control terminal coupled to the control terminal of the second transistor, a first terminal coupled to a second terminal of the tenth transistor, and a second terminal coupled to the second terminal of the sixth transistor;

the signal amplifying apparatus further comprises:

a DC level shifter, coupled between the third and fourth transistors and between the fifth and sixth transistors;

a twelfth transistor, having a first terminal coupled to a second terminal of the third transistor;

a thirteenth transistor, having a control terminal coupled to a control terminal of the twelfth transistor and the first terminal of the fifth transistor, and a first terminal coupled to a second terminal of the fifth transistor;

a fourteenth transistor, having a control terminal coupled to the first terminal of the third transistor, and a first terminal coupled to the first output port of the output stage circuit; and a second capacitor, having a first terminal coupled to the first output port of the output stage circuit and a second terminal coupled to the second terminal of the third transistor, wherein the second terminal of the second capacitor is not connected to the first input port of the output stage; and an equivalent oxide thickness of each of the third, fourth, fifth, and sixth transistors is smaller than an equivalent oxide thickness of at least one of the first, second, third, seventh, eighth, ninth, tenth, eleventh, twelfth, thirteenth, and fourteenth transistors.

9. The signal amplifying apparatus of claim 8, wherein the equivalent oxide thickness of each of the third, fourth, fifth, and sixth transistors is smaller than an equivalent oxide thickness of each of the first, second, third, seventh, eighth, ninth, tenth, eleventh, twelfth, thirteenth, and fourteenth transistors.

10. The signal amplifying apparatus of claim 4, wherein the output stage circuit further has a second input port coupled to the cascoded circuit, and a second output port for outputting a second output signal, where the first output signal and the second output signal form a differential signal; and the signal amplifying apparatus further comprises:

a second capacitor, having a first terminal connected to the second output port of the output stage and a second terminal coupled to the cascoded circuit, wherein the second terminal of the second capacitor is not connected to the second input port of the output stage.

11. The signal amplifying apparatus of claim 10, wherein the input stage comprises:

a first transistor having a control terminal for receiving the first input signal;

a second transistor having a control terminal for receiving the second input signal;

the cascoded circuit is coupled to a first terminal of the first transistor and a first terminal of the second transistor, and comprises:
- a third transistor, having a first terminal coupled to the first terminal of the first transistor;
- a fourth transistor, having a first terminal coupled to a second terminal of the third transistor;
- a fifth transistor, having a first terminal coupled to the first terminal of the second transistor;
- a sixth transistor, having a first terminal coupled to a second terminal of the fifth transistor;

the output stage circuit comprises:
- a seventh transistor, having a control terminal coupled to the first terminal of the third transistor, for outputting the first output signal at a first terminal of the seventh transistor;
- an eighth transistor, having a control terminal coupled to the first terminal of the fifth transistor, for outputting the second output signal at a first terminal of the eighth transistor;

the first terminal of the first capacitor is coupled to the first terminal of the seventh transistor and the second terminal of the first capacitor is coupled to a second terminal of the fourth transistor; and an equivalent oxide thickness of each of the fourth and sixth transistors is smaller than an equivalent oxide thickness of at least one of the first, second, third, fifth, seventh, and eighth transistors.

12. The signal amplifying apparatus of claim 11, wherein the equivalent oxide thickness of each of the fourth and sixth transistors is smaller than an equivalent oxide thickness of each of the first, second, third, fifth, seventh, and eighth transistors.

* * * * *